（12） United States Patent
Nishimura et al.

(10) Patent No.: US 9,217,925 B2
(45) Date of Patent: Dec. 22, 2015

(54) METHOD FOR PRODUCING PATTERN PHASE DIFFERENCE FILM, PATTERN PHASE DIFFERENCE FILM, AND IMAGE DISPLAY DEVICE

(75) Inventors: Hiroyuki Nishimura, Tokyo (JP); Yoshihide Nakao, Tokyo (JP); Tomoya Kawashima, Tokyo (JP); Kazuki Yamada, Tokyo (JP); Keiji Kashima, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/236,460

(22) PCT Filed: Aug. 29, 2012

(86) PCT No.: PCT/JP2012/071783
§ 371 (c)(1),
(2), (4) Date: Jan. 31, 2014

(87) PCT Pub. No.: WO2013/031802
PCT Pub. Date: Mar. 7, 2013

(65) Prior Publication Data
US 2014/0199528 A1    Jul. 17, 2014

(30) Foreign Application Priority Data
Aug. 31, 2011   (JP) .................... 2011-188384

(51) Int. Cl.
*B32B 3/00*    (2006.01)
*G03F 7/20*    (2006.01)
*G02B 5/30*    (2006.01)
(Continued)

(52) U.S. Cl.
CPC ............ *G03F 7/2022* (2013.01); *G02B 5/3083* (2013.01); *G02F 2001/133631* (2013.01); *G02F 2413/09* (2013.01); *H04N 13/0434* (2013.01); *Y10T 428/24802* (2015.01)

(58) Field of Classification Search
CPC ............ G03F 7/2022; Y10T 428/1005; Y10T 428/1041; Y10T 428/24802
See application file for complete search history.

(56) References Cited

U.S. PATENT DOCUMENTS

| 6,368,760 B1 | 4/2002 | Nishiguchi |
| 2010/0073604 A1 | 3/2010 | Okuyama et al. |
| 2011/0242478 A1 | 10/2011 | Yakushiji et al. |

FOREIGN PATENT DOCUMENTS

| JP | A-01-153707 | 6/1989 |
| JP | A-05-093810 | 4/1993 |
| JP | A-11-248922 | 9/1999 |

(Continued)

OTHER PUBLICATIONS

International Search Report issued in Application No. PCT/JP2012/071783; Dated Nov. 13, 2012 (With Translation).

(Continued)

*Primary Examiner* — Elizabeth Mulvaney
(74) *Attorney, Agent, or Firm* — Oliff PLC

(57) ABSTRACT

A pattern phase difference film, which is used to display 3D images using a passive system, and provides a method for producing a pattern phase difference film that can be manufactured with high precision, easily and in large quantities. A mask, which has slits that are made narrow compared to the width of a region that is to undergo exposure treatment and are provided for exposure treatment, is manufactured.

4 Claims, 14 Drawing Sheets

(51) Int. Cl.
*H04N 13/04* (2006.01)
*G02F 1/13363* (2006.01)

(56) References Cited

FOREIGN PATENT DOCUMENTS

| JP | A-2005-049865 | 2/2005 |
|---|---|---|
| JP | A-2009-193014 | 8/2009 |
| JP | A-2010-152296 | 7/2010 |
| JP | A-2011-158574 | 8/2011 |
| WO | 2010/070772 A1 | 6/2010 |

OTHER PUBLICATIONS

Office Action issued in Japanese Patent Application No. 2013-531347 mailed on Aug. 5, 2014.

Sep. 18, 2015 Chinese Office Action issued in Chinese Application No. 201280041223.1.

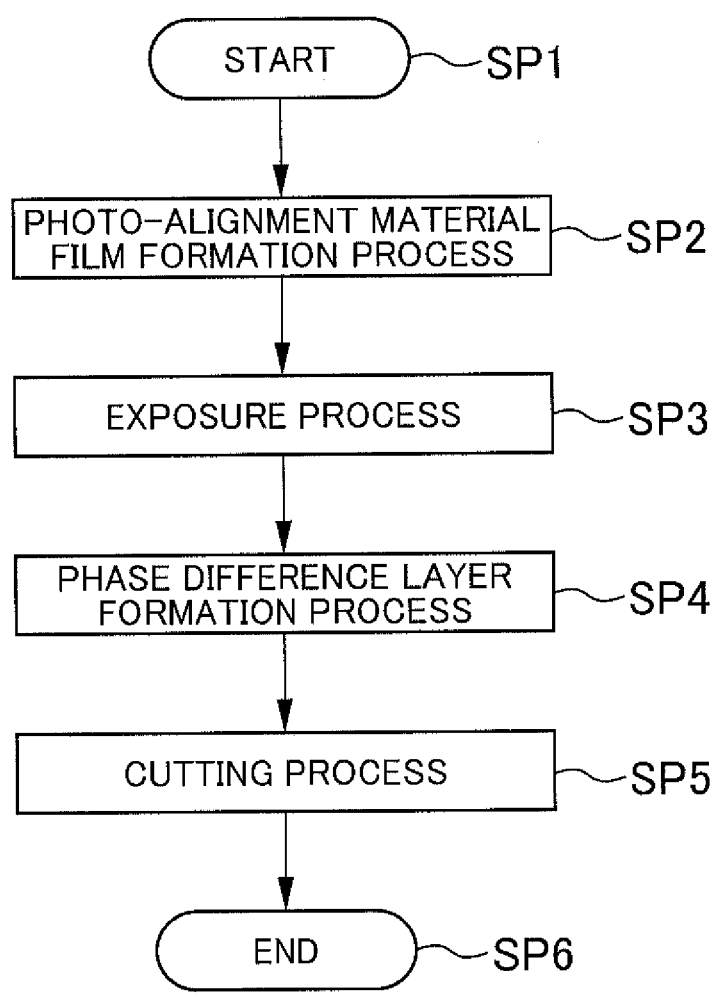

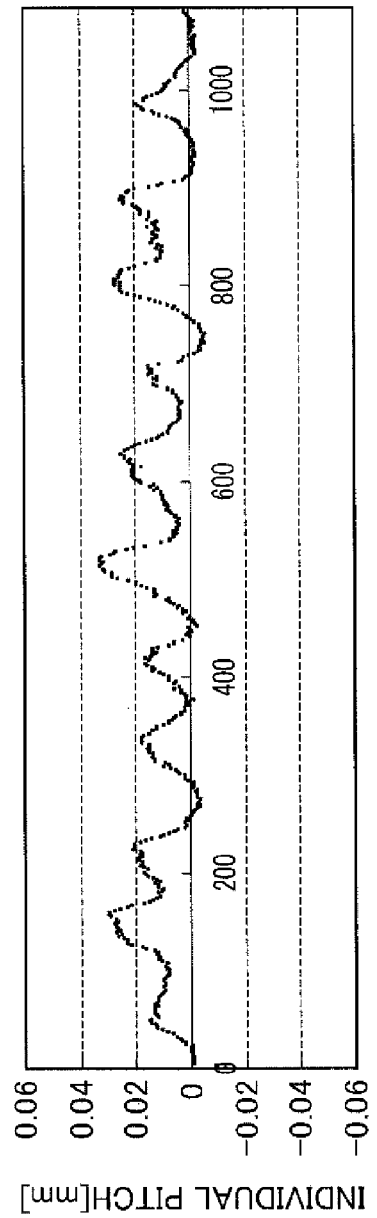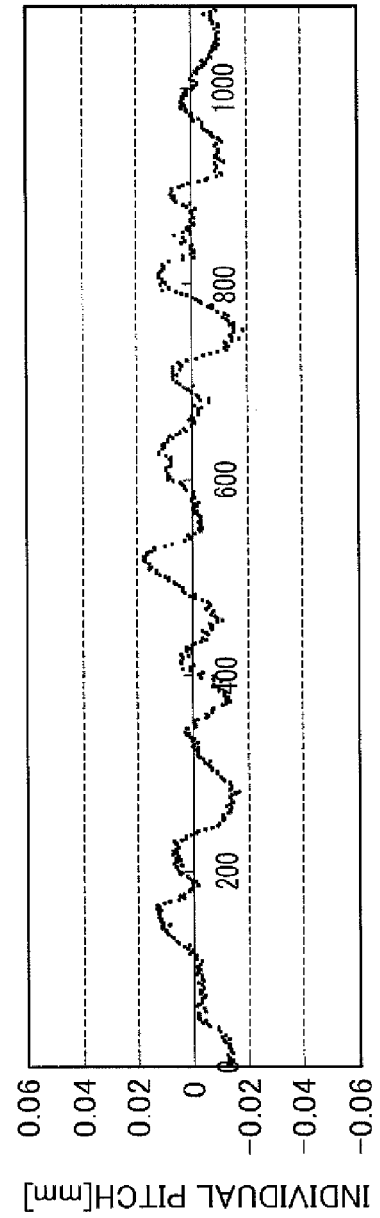

METHOD FOR PRODUCING PATTERN PHASE DIFFERENCE FILM, PATTERN PHASE DIFFERENCE FILM, AND IMAGE DISPLAY DEVICE

TECHNICAL FIELD

The present invention relates to a method for producing a pattern phase difference film applied to a 3D image display using a passive system.

BACKGROUND ART

To date, 2D display has been the mainstream in most flat panel display devices. However, in recent years, flat panel display devices capable of performing 3D display have drawn much attention, and some of them are coming onto the market. Since it is expected that future flat panel display devices will tend to be naturally required to have a 3D display function, the flat panel display devices capable of performing 3D display have been widely researched in a wide range of fields.

In general, in order to perform 3D displaying on a flat panel display device, a right-eye image and a left-eye image need to be selectively applied to the right and left eyes of a viewer in a certain method. For example, as a method for selectively applying the right-eye image and the left-eye image, a passive-type 3D display method is known. The passive-type 3D display method will be described with reference to the drawings. FIG. 14 is a schematic diagram illustrating an example of a passive-type 3D display using a liquid crystal display panel. In the example illustrated in FIG. 14, in a liquid crystal display panel, vertically consecutive pixels are sequentially and alternately allocated for right-eye pixels and left-eye pixels and are driven according to right-eye image data and left-eye image data, so that a right-eye image and a left-eye image are simultaneously displayed. Furthermore, a pattern phase difference film is arranged on a panel surface of the liquid crystal display panel to convert linearly polarized light beams emitted from the right-eye pixels and left-eye pixels into circularly polarized light beams having different polarization directions for the right-eye image and the left-eye image. Accordingly, in the passive type, a viewer puts on glasses with corresponding polarizing filters, so that a right-eye image and a left-eye image are selectively applied to the right and left eyes of the viewer.

The passive type can be applied to a liquid crystal display device having a low response speed, and 3D displaying can be performed with a simple and easy configuration employing a pattern phase difference film and circular polarizing glasses. Therefore, a passive-type liquid crystal display device has drawn much attention as a key component for a next-generation display device.

In the pattern phase difference film associated with the passive type, a pattern-shaped phase difference layer applying phase difference to transmitting light corresponding to pixel allocation is necessary. Pattern phase difference film has not been widely researched and developed yet, and no standard technique thereof has been established as yet.

With respect to the pattern phase difference film, Patent Document 1 discloses a method for producing a pattern phase difference film by forming a photo-alignment film which controls an alignment regulation force on a glass substrate and the patterning arrangement of the liquid crystal molecules by using the photo-alignment film. However, in the method disclosed in Patent Document 1, since the glass substrate needs to be used and the pattern phase difference film is expensive, there is a problem in that it is difficult to perform mass production of large-area pattern phase difference film.

In addition, with respect to the pattern phase difference film, Patent Document 2 discloses a method for producing a photo-alignment film which controls the alignment regulation force in a patterned shape by forming a fine convex-concave shape in the periphery of the roll plate through laser irradiation and by transferring the convex-concave shape onto the film. In the method disclosed in Patent Document 2, the entire circumference of the roll plate needs to be irradiated by laser in full through laser scanning. Therefore, there is a problem in that much time is taken to manufacture the roll plate. In addition, there is a problem in that an expensive laser machining apparatus needs to be used.

[Patent Document 1] Japanese Unexamined Patent Application, Publication No. 2005-49865

[Patent Document 2] Japanese Unexamined Patent Application, Publication No. 2010-152296

DISCLOSURE OF THE INVENTION

Problems to be Solved by the Invention

The present invention has been achieved in view of such circumstances, and an object thereof is to provide a pattern phase difference film applied to passive-type 3D image display and a method capable of simply and easily performing mass production of the pattern phase difference film with high accuracy.

Means for Solving the Problems

The inventor of the present invention conducted thorough investigations in order to achieve the object, and as a result, the present invention was completed by considering that the mask used for the exposure process is formed by setting the slit width to be smaller than the area width of the area to be exposed.

(1) According to an aspect of the present invention, a method is provided for producing a pattern phase difference film by sequentially processing an elongated transparent film material while transporting the elongated transparent film material, including:

forming a photo-alignment material film on the transparent film material;

forming an alignment film by performing an exposure process on the photo-alignment material film by using a mask through a photo-alignment method; and forming a phase difference layer of a right-eye area applying phase difference corresponding to right-eye transmitting light and a left-eye area applying phase difference corresponding to left-eye transmitting light on the alignment film, wherein, in the exposure process, the alignment film is formed by selectively exposing the photo-alignment material film by using the mask in a first exposure process, and after that, exposing a non-exposed area in the first exposure process by irradiating the entire surface with light in a second exposure process, and thus the photo-alignment material film of the portion corresponding to the right-eye area or the left-eye area is aligned, and after that, the photo-alignment material film of the portion corresponding to the left-eye area or the right-eye area is aligned, and wherein the mask is formed so that the slit width of the mask is smaller than the area width of the areas used for the first exposure process.

According to the aspect (1), the pattern phase difference film can be produced by performing consecutive processes on the elongated transparent film material so that it is possible to simply and easily produce the pattern phase difference film in mass production. However, in this case, since the mask is allowed to be close to the object material, it is difficult to perform the exposure process, so the accuracy of the consecutive exposure processes is deteriorated. Therefore, the slit width is set to be smaller than the area width of the areas used for the first exposure process, and the area width of the right-eye area and the area width of the left-eye area width are set not to be greatly different from each other, so that it is possible to produce the pattern phase difference film with high accuracy.

(2) According to an aspect of the present invention, a method is provided for producing a pattern phase difference film by sequentially processing an elongated transparent film material while transporting the elongated transparent film material, including:

forming a photo-alignment material film on the transparent film material;

forming an alignment film by performing an exposure process on the photo-alignment material film by using a mask through a photo-alignment method; and forming a phase difference layer of the right-eye area applying phase difference corresponding to right-eye transmitting light and the left-eye area applying phase difference corresponding to left-eye transmitting light on the alignment film, wherein, in the exposure process, the alignment film is formed by exposing the entire surface of the photo-alignment material film in a first exposure process, and after that, selectively exposing the photo-alignment material film by using the mask in a second exposure process, and thus the photo-alignment material film of the portions corresponding to the right-eye area and the left-eye area is aligned, and after that, the photo-alignment material film of the portion corresponding to the right-eye area or the left-eye area is aligned again, and wherein the mask is formed so that the slit width of the mask is smaller than the area width of the areas used for the second exposure process.

According to the aspect (2), the pattern phase difference film can be produced by performing consecutive processes on the elongated transparent film material, so that it is possible to simply and easily produce the pattern phase difference film in mass production. However, in this case, since the mask is allowed to be close to the object material, it is difficult to perform the exposure process, so the accuracy of the consecutive exposure processes is deteriorated. Therefore, the slit width is set to be smaller than the area width of the areas used for the second exposure process, and the area width of the right-eye area and the area width of the left-eye area width are set not to be greatly different from each other, so that it is possible to produce the pattern phase difference film with high accuracy.

(3) According to an aspect of the present invention, a method is provided for producing a pattern phase difference film by sequentially processing an elongated transparent film material while transporting the elongated transparent film material, including:

forming a photo-alignment material film on the transparent film material;

forming an alignment film by performing an exposure process on the photo-alignment material film by using a mask through a photo-alignment method; and forming a phase difference layer of the right-eye area applying phase difference corresponding to right-eye transmitting light and the left-eye area applying phase difference corresponding to left-eye transmitting light on the alignment film, wherein, in the exposure process, the alignment film is formed by aligning the photo-alignment material film of the portions corresponding to the right-eye areas or the left-eye areas through an exposure process using a mask in a first exposure process, and after that, by aligning the photo-alignment material film of the portions corresponding to the left-eye areas or the right-eye areas through an exposure process using a mask in a second exposure process, wherein the photo-alignment material film is formed by using a photo-alignment material of which the alignment is not changed according to an exposure process once the photo-alignment material is aligned, and wherein the mask used for the first exposure process is formed so that the slit width of each slit of the mask is set to be smaller than the area width of each area used for the exposure process.

According to the aspect (3), the pattern phase difference film can be produced by performing consecutive processes on the elongated transparent film material so that it is possible to simply and easily produce the pattern phase difference film in mass production. However, in this case, since the mask is allowed to be close to the object material, it is difficult to perform the exposure process, so the accuracy of the consecutive exposure processes is deteriorated. Therefore, the slit width is set to be smaller than the area width of the areas used for the first exposure process among the consecutive exposure processes, and the area width of the right-eye area and the area width of the left-eye area width are set to be not greatly different from each other, so that it is possible to produce the pattern phase difference film with high accuracy.

(4) According to an aspect of the present invention, a method is provided for producing a pattern phase difference film by sequentially processing an elongated transparent film material while transporting the elongated transparent film material, including:

forming a photo-alignment material film on the transparent film material;

forming an alignment film by performing an exposure process on the photo-alignment material film by using a mask through a photo-alignment method; and forming a phase difference layer of the right-eye area applying phase difference corresponding to right-eye transmitting light and the left-eye area applying phase difference corresponding to left-eye transmitting light on the alignment film, wherein, in the exposure process, the alignment film is formed by aligning the photo-alignment material film of portions corresponding to the right-eye areas or the left-eye areas through an exposure process using a mask in a first exposure process, and after that, by aligning the photo-alignment material film of portions corresponding to the left-eye areas or the right-eye areas through an exposure process using a mask in a second exposure process, wherein the photo-alignment material film is formed by using a photo-alignment material of which the alignment direction is changed in each of the repetitive exposure processes, wherein the mask used for the second exposure process is formed so that the slit width of each slit of the mask is set to be smaller than the area width of each area used for the exposure process.

According to the aspect (4), the pattern phase difference film can be produced by performing consecutive processes on the elongated transparent film material so that it is possible to simply and easily produce the pattern phase difference film in mass production. However, in this case, since the mask is allowed to be close to the object material, it is difficult to perform the exposure process, so the accuracy of the consecutive exposure processes is deteriorated. Therefore, the slit width is set to be smaller than the area width of the areas used for the second exposure process among the consecutive exposure processes, and the area width of the right-eye area and the area width of the left-eye area width are set to be not greatly different from each other, so that it is possible to produce the pattern phase difference film with high accuracy.

(5) According to an aspect of the present invention, a pattern phase difference film is provided in which a photo-alignment film and a phase difference layer are sequentially installed on a substrate made of a transparent film material and the phase difference layer applies a phase difference to transmitting light, wherein first and second areas applying first phase difference and second phase difference to the transmitting light are sequentially and alternately formed on the phase difference layer, and wherein non-aligned areas are formed at boundaries between the first and second areas.

According to the aspect (5), due to the non-aligned area, it is possible to effectively prevent the occurrence of a stripe shaped area the brightness of which is different from those of other portions.

(6) In the aspect (5), the area width of the non-aligned area is 9 μm or more and 25 μm or less.

According to the aspect (6), it is possible to sufficiently prevent the occurrence of a stripe shaped area the brightness of which is different from those of other portions in practical use.

(7) An image display device is configured by arranging the pattern phase difference film according to the aspect (5) or (6) on a front surface of the image display device.

According to the aspect (7), it is possible to effectively prevent the occurrence of a stripe shaped area the brightness of which is different from those of other portions, and it is possible to provide an image display device capable of performing passive-type 3D displaying.

(8) In the aspect (1) or (2), in the exposure process, the distance between the mask and the photo-alignment material film is set to be 150 μm or more and 650 μm or less.

According to the aspect (8), in the producing method according to the aspect (1) or (2), by setting the distance between the mask and the photo-alignment material film, it is possible to produce a pattern phase difference film capable of sufficiently preventing the occurrence of a stripe shaped area the brightness of which is different from those of other portions in practical use.

(9) In the aspect (3) or (4), in the exposure process, the distance between the mask and the photo-alignment material film used for the first and/or second exposure process is set to be 150 μm or more and 650 μm or less.

According to the aspect (9), in the producing method according to the aspect (3) or (4), by setting the distance between the mask and the photo-alignment material film, it is possible to produce a pattern phase difference film capable of sufficiently preventing the occurrence of a stripe shaped area the brightness of which is different from those of other portions in practical use.

Effects of the Invention

It is possible to simply and easily perform mass production of a pattern phase difference film with high accuracy.

BRIEF DESCRIPTION OF THE DRAWINGS

FIG. 2 is a flowchart illustrating a method for producing the pattern phase difference film of FIG. 1.

FIG. 5 is a diagram illustrating the result of correction of a mask.

EXPLANATION OF REFERENCE NUMERALS

1: Pattern phase difference film
2: Substrate
3: Alignment film
4: Phase difference layer
16, 16A, 16E: Mask

PREFERRED MODE FOR CARRYING OUT THE INVENTION

First Embodiment

Figure 1:
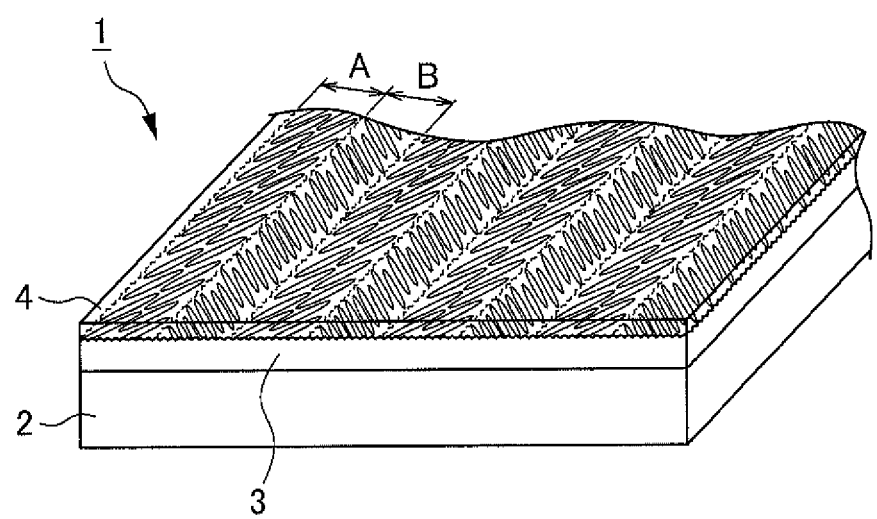
FIG. 1 is a diagram illustrating a pattern phase difference film according to a first embodiment of the present invention.

FIG. 1 is a diagram illustrating the pattern phase difference film according to the first embodiment of the present invention. A pattern phase difference film 1 is produced by sequentially installing an alignment film 3 and a phase difference layer 4 on a substrate 2 made of a transparent film material. In the pattern phase difference film 1, the phase difference layer 4 is made of a liquid crystal material, and alignment of the liquid crystal material is patterned by the alignment regulation force of the alignment film 3. In FIG. 1, the alignment of the liquid crystal molecules is indicated by an elongated ellipse. In the pattern phase difference film 1, right-eye areas A and left-eye areas B with predetermined widths are sequentially and alternately formed in a stripe shape corresponding to allocation of pixels of a liquid crystal display panel through the patterning, so that the corresponding phase differences are provided to light beams emitted from right-eye pixels and left-eye pixels.

In the pattern phase difference film 1, after the photo-alignment material film is formed by using a photo-alignment material, the alignment film 3 is formed by irradiating a photo-alignment material film with a UV light having linear polarization according to so-called photo-alignment method. Herein, polarization directions of the UV light irradiated on the photo-alignment material film are set to be different by 90 degrees between the right-eye area A and the left-eye area B. Therefore, with respect to the liquid crystal material installed in the phase difference layer 4, the liquid crystal molecules are aligned in the directions corresponding to the right-eye area A and the left-eye area B, so that the corresponding phase differences are provided to the transmitting light beams.

FIG. 2 is a flowchart illustrating a method for producing the pattern phase difference film 1. In the method for producing the pattern phase difference film 1, the substrate 2 is provided as an elongated film wound around a roll, and the substrate 2 is extracted from the roll so that the photo-alignment material film is sequentially formed (Steps SP1 and SP2). Herein, although the photo-alignment material film may be formed by applying various manufacturing processes, in the embodiment, the photo-alignment material film is formed by applying a film formation solution in which a photo-alignment material is dispersed in a solvent such as benzene by a die, and after that, by drying. In addition, although various materials being applicable to the photo-alignment method may be used as the photo-alignment material, in the embodiment, a material of which alignment is not changed by UV light irradiation after the alignment, for example, a photo-dimerization type material is used. In addition, examples of the photo-dimerization type material are disclosed in "M. Schadt, K. Schmitt, V. Kozinkov and V. Chigrinov: Jpn. J. Appl. Phys., 31, 2155 (1992)", "M. Schadt, H. Seiberle and A. Schuster: Nature, 381, 212 (1996)", and the like, and a material, for example, "ROP-103" (product name) is already commercialized. In addition, for example, triacetyl cellulose is used as the substrate 2.

Next, in the producing method, the photo-alignment film is formed by UV light irradiation through an exposure process (Step SP3). Subsequently, in the phase difference layer formation process of the producing method, the phase difference layer 4 is formed by applying a liquid crystal material by a die or the like and curing the liquid crystal material by UV light irradiation (Step SP4). Subsequently, in the producing method, if necessary, an anti-reflection film formation process or the like is performed, and after that, in a cutting process, the pattern phase difference film 1 is produced by cutting into the desired size (Steps SP5 and SP6).

Figure 3A:
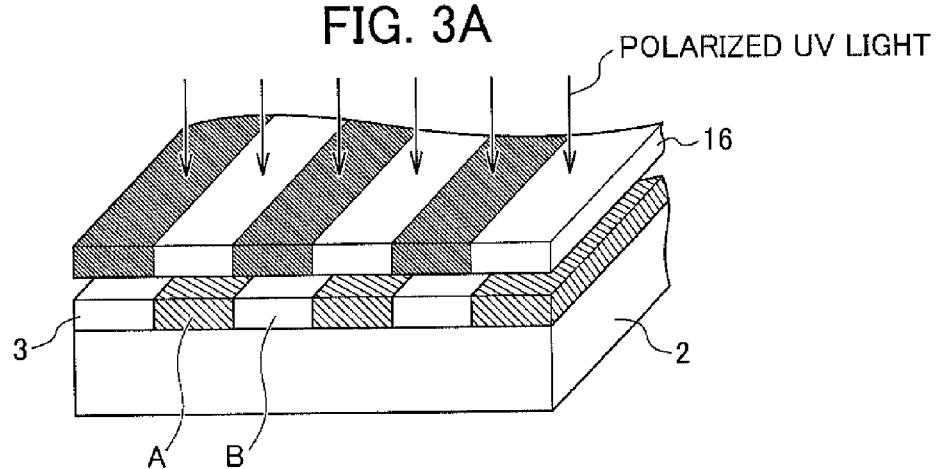
FIG. 3 is a diagram illustrating the exposure process of FIG. 2.
Figure 3B:
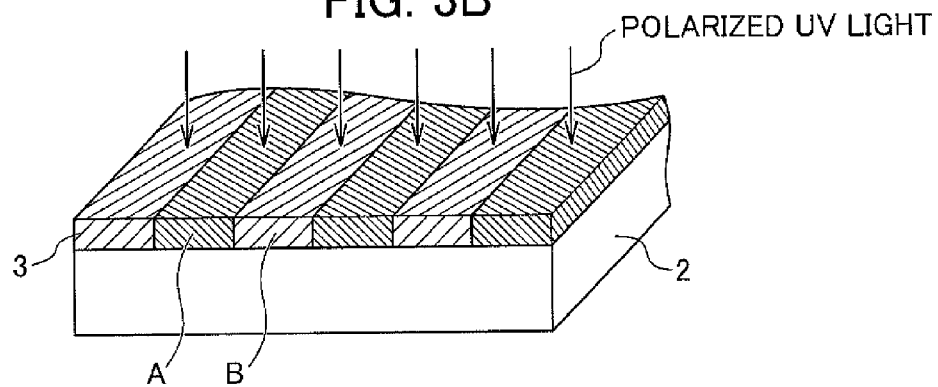

FIG. 3 is a detailed diagram illustrating the exposure process. In the producing method, by irradiation of UV light (polarized UV light) having linear polarization through masks 16 blocking portions corresponding to the right-eye areas A and the left-eye areas B, the photo-alignment material film in the non-blocked left-eye areas B or right-eye areas A is aligned in the desired direction (FIG. 3A). Therefore, in the producing method, the first exposure process is performed. Subsequently, in the producing method, the entire surface is irradiated with UV light having linear polarization the direction of which is different by 90 degrees from the polarization direction in the first exposure process, and the photo-alignment material film in the right-eye areas A or the left-eye areas B which is not exposed in the first exposure process is aligned in a desired direction (FIG. 3B). Therefore, in the producing method, the right-eye areas A and the left-eye areas B are sequentially exposed through the two exposure processes, so that the alignment film 3 is formed.

Figure 4:
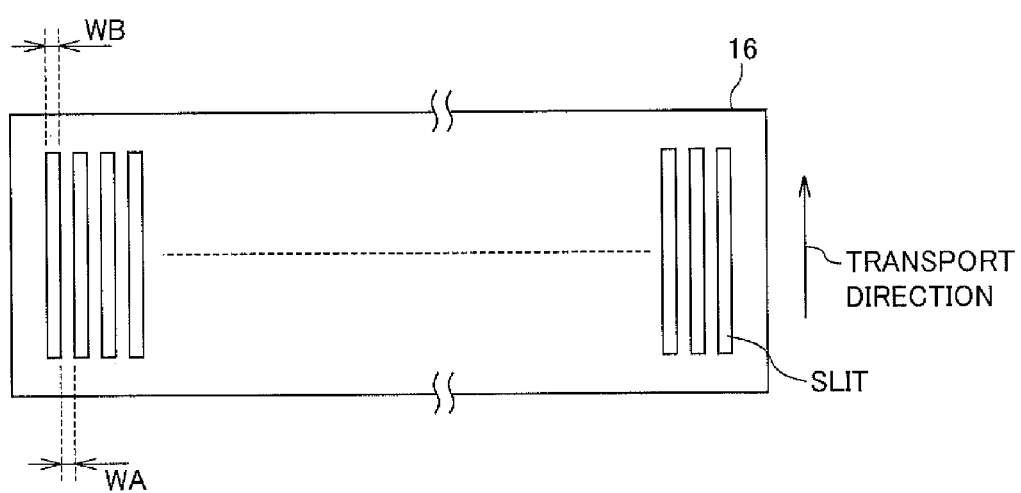
FIG. 4 is a diagram illustrating a mask used for the exposure process of FIG. 2.

FIG. 4 is a plan view illustrating a mask used for the first exposure process. The mask 16 is formed based on the width of the elongated substrate 2, and slits having an elongated rectangular shape extending in the transport direction of the substrate 2 are sequentially installed in a predetermined interval. Therefore, in the producing method, during the period when the substrate 2 is transported under the slits, the substrate 2 is irradiated with the light from the light source, so that the first exposure process is performed.

In this manner, in the pattern phase difference film 1, it is necessary to perform the exposure process with high accuracy by forming the alignment film 3 by UV light irradiation through the exposure process and patterning the phase difference layer 4 by the alignment regulation force of the alignment film 3 so as to correspond to the right-eye areas A and the left-eye areas B. In a passive type, generally, pixels consecutively arranged in the vertical direction on the liquid crystal display panel are sequentially and alternately allocated for right-eye pixels and left-eye pixels. In the pattern phase difference film 1, the area widths of the right-eye area A and the left-eye area B are set to be equal to each other and are set to be a pitch of pixels of a liquid crystal display panel on which the pixels are to be mounted.

However, in the exposure process for the elongated continuous film, it is difficult to perform the exposure process while allowing the mask 16 to be in close contact with the substrate 2, and the light used for the exposure cannot also be set as entirely parallel light. Therefore, in the first exposure process of the producing method, it is considered that the area width, which is exposed, is larger than the slit width formed on the mask 16. Like this, if the area width which is exposed in the first exposure process is large, for example, in a case where the slit width WB corresponding to the right-eye area width and the left-eye area width, and the blocked area width WA between the slits are formed to be equal to each other (refer to FIG. 4), the area widths of the right-eye area A and the left-eye area B in the pattern phase difference film 1 are different from one another.

In addition, in the process of producing the pattern phase difference film 1, the process of exposing the wide substrate 2 is needed. However, with respect to the size corresponding to the width of the substrate 2, it is difficult to secure a light source having a sufficiently uniform light amount of emitted light. Therefore, the area width between the right-eye area A and the left-eye area B is changed in the width direction. As a result, it was found that a difference (A−B) in area width between the right-eye area A and the left-eye area B is changed in each portion of the pattern phase difference film 1, so that when the pattern phase difference film 1 is installed in the liquid crystal display panel, at the portion where the difference (A−B) in area width is large, the difference (A−B) is seen as a laterally striped shape, and thus, image quality is deteriorated.

Therefore, in the embodiment, the mask 16 used for the first exposure process is formed by setting the slit width to be smaller than the area width of the area to be exposed so as to reduce the difference (A−B) in area width so that the accuracy of the pattern phase difference film 1 is improved, and thus, the occurrence of the laterally striped shape is prevented.

Namely, in the producing method, the right-eye area A or the left-eye area B is selectively exposed in the first exposure process, and the non-exposed area in the first exposure process is exposed in the second exposure process, and the difference in area width between the exposed area in the first exposure process and the not-exposed area in the first exposure process becomes the difference (A−B) in area width in the pattern phase difference film 1. Therefore, the difference in area width is actually measured, and the slit width of the mask 16 is corrected based on the measured value, so that the mask 16 is formed. More specifically, in the embodiment, the pattern phase difference film 1 for the measurement is formed. Next, the area widths of the consecutive areas A or B are measured, and the area width of the area A or B is calculated by averaging the measured values. In addition, the mask 16 is formed by setting the slit width WB to be smaller than the area width of the area to be exposed based on the calculated width.

According to the result of the actual measurement, it can be understood that the area width of the area exposed in the first exposure process is larger by 7 μm on average than the slit width WB, and thus, the difference (A−B) in area width occurring in the pattern phase difference film 1 is 14 μm. In addition, instead of the average value of the area widths of the consecutive areas, the area width can be calculated, for example, by averaging the measured values obtained through sampling at a predetermined interval. As a measurement method, various methods capable of securing a sufficient measurement system in practical use may be applied. In the embodiment, the mask 16 is formed based on the result of the measurement so that the slit width WB is smaller by 7 μm than the desired area width of the area A or B.

FIG. 5 is a diagram illustrating the result of the measurement. It can be understood that, in a case where the mask 16 is formed so that the widths of the blocked portion and the non-blocked portion are equal to each other, as illustrated in FIG. 5A, the area width of the area exposed in the first exposure process is biased in one direction from a desired design value (indicated by 0 mm), so that the difference in area width is increased. However, in the case where the mask 16 is corrected (FIG. 5B), the area width processed in the first exposure process is changed to be about the desired design value (indicated by 0 mm). Therefore, it is seen that, in comparison to the case where no correction is performed, the difference in area width is decreased overall, and the accuracy of the pattern phase difference film 1 is remarkably improved.

According to the embodiment, in a case where the alignment film is formed by performing the exposure process by using the mask and, after that, by performing the exposure process on the entire surface, the slit width of the mask is set to be smaller than the area width of the exposed area, so that it is possible to produce the pattern phase difference film with high accuracy. In addition, in this case, it is possible to simply and easily perform mass production through the process for the elongated continuous transparent film.

Second Embodiment

Figure 6A:
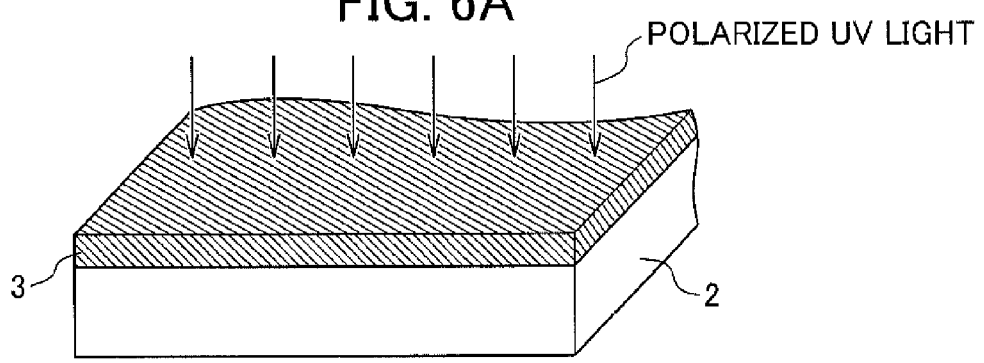
FIG. 6 is a diagram illustrating an exposure process according to a second embodiment of the present invention.
Figure 6B:
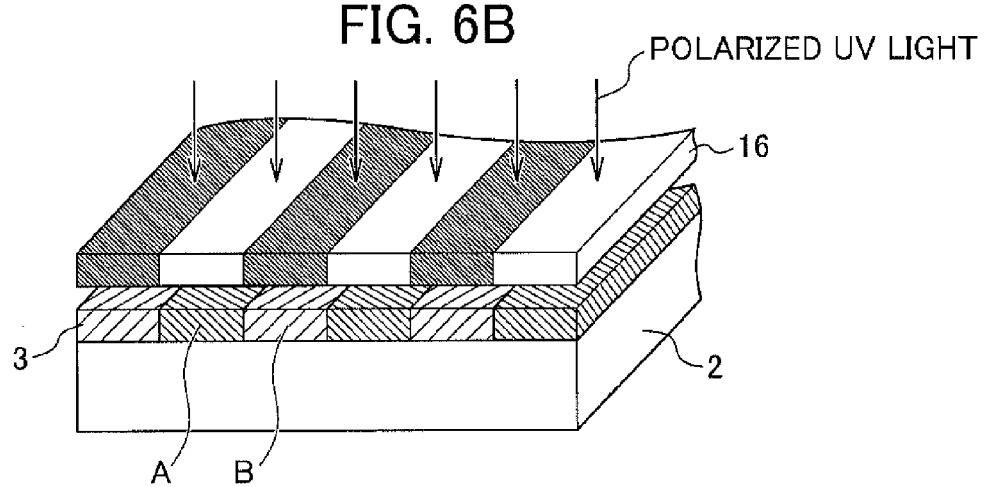

FIG. 6 is a diagram illustrating an exposure process according to the second embodiment of the present invention in comparison to FIG. 3. Configurations of the method for producing a pattern phase difference film according to the embodiment are the same as those of the first embodiment except for the configuration relating to the exposure process.

In a first exposure process of the exposure process, the entire surface is irradiated with UV light having linear polarization (FIG. 6A). Subsequently, in the second exposure process, the portions corresponding to the right-eye areas or the left-eye areas are irradiated with UV light having linear polarization by using the mask 16, so that the exposure is performed again. Therefore, unlike the first embodiment, in the embodiment, a material the alignment direction of which is changed in each of the repetitive exposure processes is used as a photo-alignment material. As the material, for example, a photo-isomerization reaction type photo-alignment material may be used. The photo-isomerization is disclosed in "W. M. Gibbons, P. J. Shannon, S. T. Sun and B. J. Swetlin: Nature, 351, 49 (1991)".

Therefore, in the embodiment, the area width of the area formed by the second exposure process is larger than the slit width of the mask 16. Accordingly, in the embodiment, the slit width of the mask 16 is formed to be smaller than the desired area width based on measured results obtained in advance.

In the embodiment, even in the case where the patterning is performed by using the mask in the second exposure process, the slit width of the mask is formed to be small, so that it is possible to obtain the same effects as those of the first embodiment.

Third Embodiment

Figure 7A:
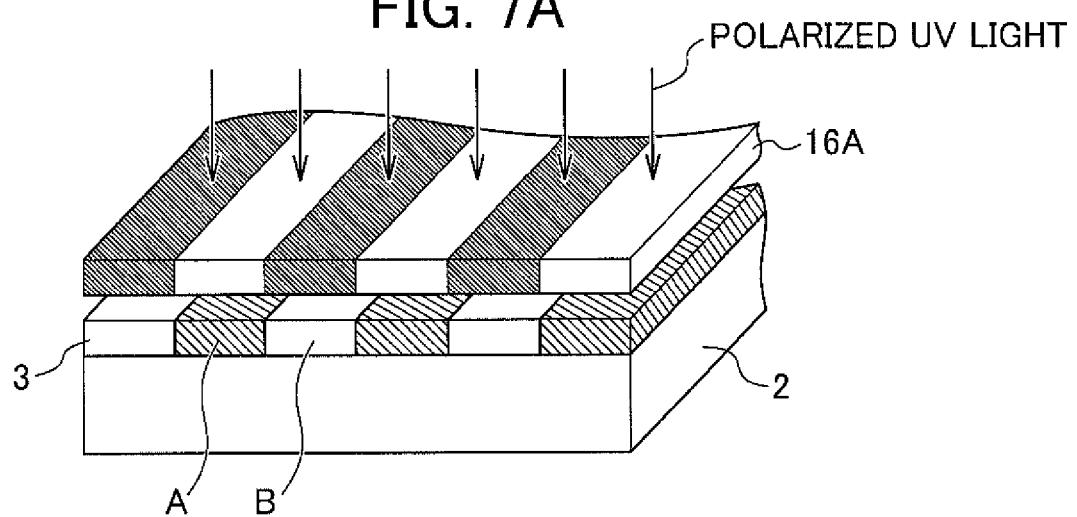
FIG. 7 is a diagram illustrating the exposure process according to the third embodiment of the present invention.
Figure 7B:
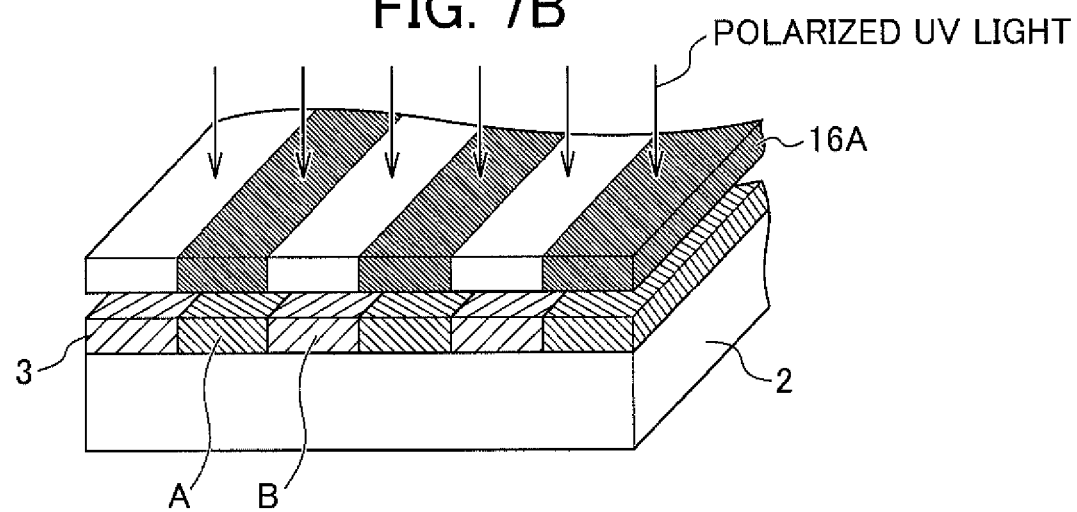

FIG. 7 is a diagram illustrating the exposure process according to a third embodiment of the present invention in comparison to FIGS. 3 and 6. Configurations of a method for producing a pattern phase difference film according to the embodiment are the same as those of the first embodiment except for the configuration relating to the exposure process.

Herein, in this exposure process, a material the alignment of which is not changed by UV light irradiation once the material is aligned is used as the photo-alignment material. Accordingly, in the exposure process, in the first exposure process, the portions corresponding to the right-eye area or the left-eye area are selectively exposed by using a mask 16A (FIG. 7A), and in the second exposure process, the portion corresponding to the remaining area is exposed by using a mask 16B. Therefore, in the embodiment, the area the width of which is larger than the slit width of the mask 16A used for the first exposure process is exposed. In addition, in the second exposure process, the portion which is not exposed in the first exposure process and is not blocked by the mask 16B is exposed. Therefore, the accuracy in the first exposure process is secured, so that the accuracy of the pattern phase difference film can be improved, and the mask 16B in the second exposure process is formed at a moderate dimensional accuracy by taking into consideration a positioning error or the like.

Therefore, in the embodiment, the slit width of the mask 16A used for the first exposure process is formed to be smaller than the desired area width based on measured results obtained in advance.

In the embodiment, even in the case of repetitively performing the exposure process by using the mask, the slit width of the mask used for the first exposure process is set to be smaller than the desired area width, so that it is possible to obtain the same effects as those of the first and second embodiments.

Fourth Embodiment

Similarly to the above-described second embodiment, in the embodiment, a material the alignment direction of which is changed in each of repetitive exposure processes is used as a photo-alignment material. Similarly to the third embodiment, in the embodiment, an alignment film is formed by using the photo-alignment material and by performing the exposure process by repetitively using the masks 16A and 16B. The configuration of the embodiment will be described with reference to FIG. 7.

In the embodiment, the mask 16A used for the first exposure process does not require high accuracy, but the mask 16B used for the second exposure process requires high accuracy. Therefore, in the embodiment, the mask 163 used for the second exposure process is formed based on the result of measurement performed in advance so that the slit width is smaller than the desired area width.

In the embodiment, even in the case where the material the alignment direction of which is changed in each of the repetitive exposure processes is used as a photo-alignment material and the exposure process using the mask is repetitively performed, the mask used for the second exposure process is formed so that the slit width is smaller than the desired area width, so that it is possible to obtain the same effects as those of the first, second, and third embodiments.

Fifth Embodiment

Figure 8:
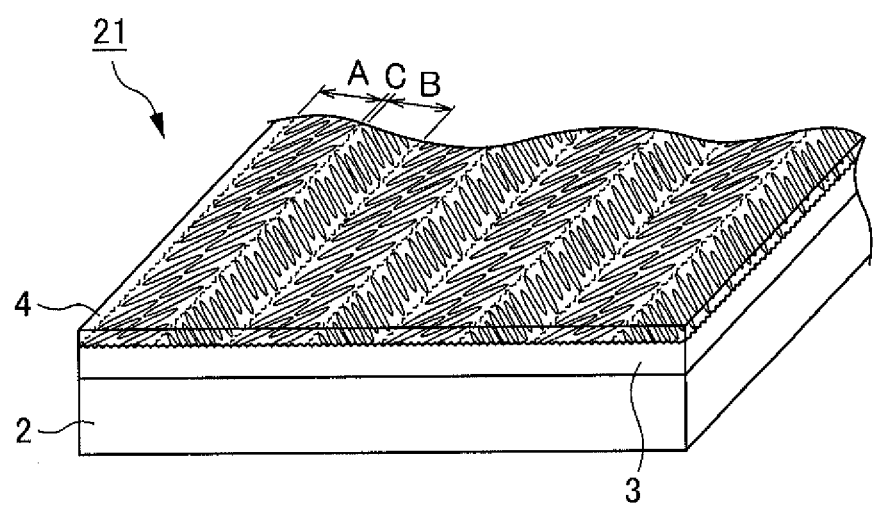
FIG. 8 is a diagram illustrating the exposure process according to the fifth embodiment of the present invention.

FIG. 8 is a diagram illustrating a pattern phase difference film according to the fifth embodiment of the present invention in comparison to FIG. 1. In FIG. 8, the same elements as those of the above-described pattern phase difference film 1 of FIG. 1 are denoted by the same reference numerals and redundant descriptions are not presented.

In an image display device according to the embodiment, pixels on a liquid crystal display panel which are consecutively arranged in the vertical direction (direction corresponding to the right and left directions in FIG. 8) are sequentially and alternately allocated for right-eye pixels for displaying a right-eye image and left-eye pixels for displaying a left-eye image and are driven by the right-eye image data and the left-eye image data. Therefore, in the image display device, the display screen is alternately divided into stripe shaped areas displaying the right-eye image and stripe shaped areas displaying the left-eye image so as to simultaneously display the right-eye image and the left-eye image. In the image display device, a pattern phase difference film 21 illustrated in FIG. 8 is installed on the surface of the liquid crystal panel, and the pattern phase difference film 21 applies the corresponding phase differences to light beams emitted from the right-eye pixels and the left-eye pixels. Accordingly, the image display device can display the desired stereoscopic image in a passive manner.

In the pattern phase difference film 21, first and second areas A and B applying first phase difference and second phase difference corresponding to transmitting light beams corresponding to the right and left eyes are sequentially and alternately formed, and non-aligned areas C are installed at the boundaries between the first and second areas A and B. Herein, the non-aligned area is an area where the phase retardation axis direction of the phase difference layer 4 does not exist or the phase retardation axis direction is at random and optical characteristic thereof does not belong to any one of the first and second areas.

Figure 9:
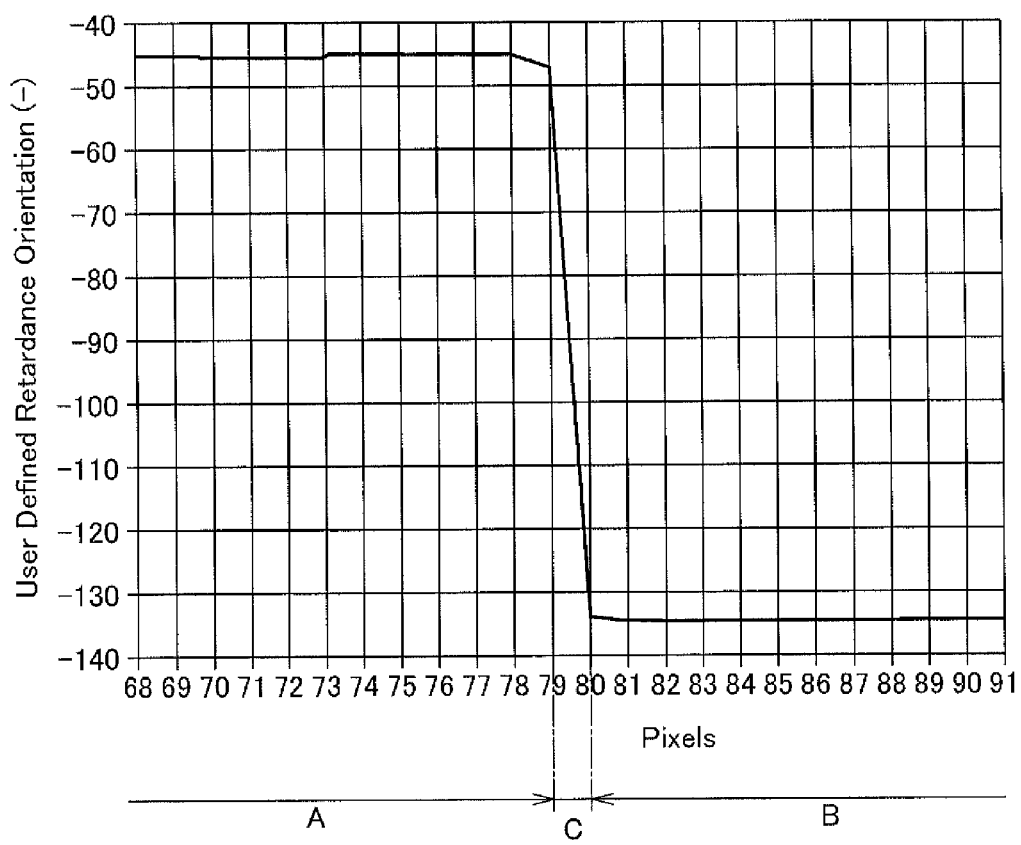
FIG. 9 is a diagram illustrating a non-aligned area.

FIG. 9 is a characteristic curve diagram for explaining an optical characteristic relating to the non-aligned area C. FIG. 9 illustrates an alignment angle (or an optical axis) of the pattern phase difference film 21 in the direction crossing the boundary, and pixels on the horizontal axis indicate coordinates of pixels of an image pickup apparatus used for measurement. It can be understood by observing the direction of the optical axis of each portion of the pattern phase difference film 21 that, in the areas A and B, the alignment angle is inclined by 45 degrees from the extension direction of the area A or B, but in the boundary, the alignment angle is greatly changed in the direction from the area A to the area B.

Due to the non-aligned area C, in the pattern phase difference film 21, it is possible to prevent the occurrence of a stripe shaped area OB the brightness of which is different from those of the other portions.

Figure 10:
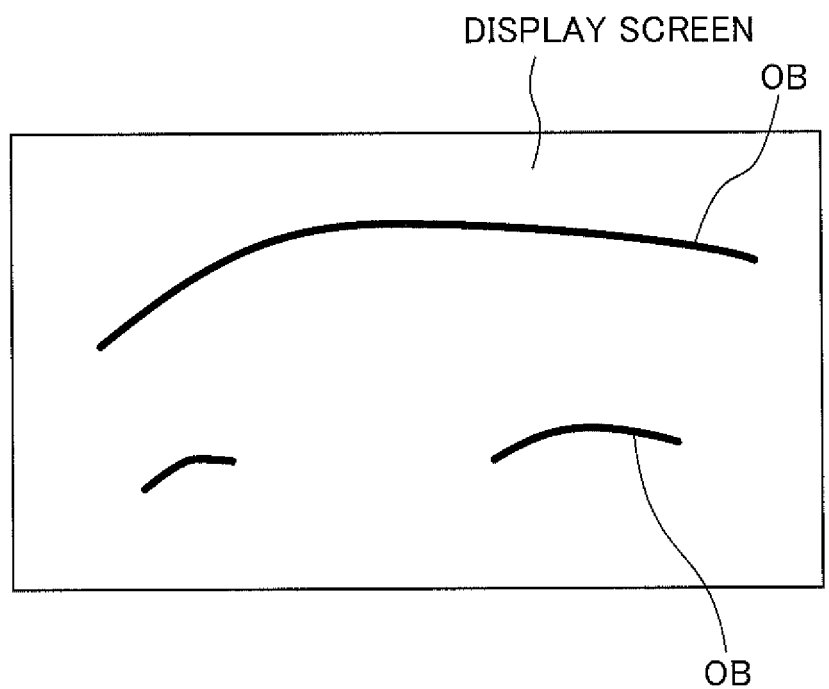
FIG. 10 is a diagram illustrating a stripe shaped area.

Namely, when a white screen is displayed by installing the pattern phase difference film on the image display panel, there is a case where image quality is greatly deteriorated due to the occurrence of a stripe shaped area OB the brightness of which is different from those of the other portions like a moiré fringe as illustrated in FIG. 10.

The shape of the stripe shaped area OB is changed as the viewing direction is changed. Herein, the pixels are arranged in a matrix shape on the image display panel, and so-called light blocking portions are installed as a black matrix between the pixels. On the other hand, in the pattern phase difference film, the right-eye areas and the left-eye areas are alternately installed on the phase difference layer so that the boundaries between the right-eye areas and the left-eye areas overlap the light-blocking portions of the image display panel. However, for example, in the case where the repetition pitch of the right-eye areas and the left-eye areas in the pattern phase difference film is slightly different from that of the light blocking portions, there may be portions where the boundaries between the areas do not entirely overlap the light blocking portions. Therefore, it is considered that the stripe shaped areas OB are observed due to regularities of the production period of the right-eye areas and the left-eye areas and the production period of the light blocking portions on the image display panel.

Meanwhile, in the embodiment, the non-aligned areas C are areas which are exposed to an insufficient light amount in the first exposure process using the mask and, after that, undergo the second exposure process. As a result, the non-aligned areas are formed so as to meander in the extension direction of the boundary. Accordingly, it is considered that the pattern phase difference film 21 is formed so that the boundaries between the first and second areas meander, so that it is possible to prevent the occurrence of a stripe shaped area OB caused by the regularities of the production period of the right-eye areas and the left-eye areas and the production period of the light blocking portions on the image display panel.

In addition, if the area width of the non-aligned area C is too large, so-called crosstalk occurs between the right-eye image and the left-eye image, so that the image quality is greatly deteriorated. However, if the area width is extremely small, it is difficult to allow the boundaries between the right-eye areas A and the left-eye areas B to sufficiently meander, so that it is difficult to effectively prevent the occurrence of interference fringes. Accordingly, the non-aligned areas C are formed so as to have a width of 9 μm or more and 25 μm or less, so that it is possible to sufficiently prevent the occurrence of interference fringes in practical use. In addition, in the case where the non-aligned areas C are formed so as to have a width of 9 μm or more and 25 μm or less, the amplitude of the meander measured from the center in the width direction of the non-aligned area is 1 μm or more and 50 μm or less.

In addition, the area width of the non-aligned area C can be measured by installing the pattern phase difference film 21 between polarizing filters in a crossed nicol alignment and measuring the amount of transmitting light. If the pattern phase difference film 21 is installed to be inclined so that the extension direction of the areas A and B is inclined by 45 degrees from the transmission axis of the polarizing filters according to the crossed nicol alignment, the transmitting light can be hardly detected in the right-eye areas A and the left-eye areas B. On the contrary, the transmitting light is detected in the non-aligned areas C. Therefore, if the amount of the transmitting light in the direction crossing the boundaries is measured, the amount of the transmitting light is increased at the portions of the non-aligned areas C. Therefore, the area width of the non-aligned areas C can be measured by measuring the amount of the transmitting light at the portions where the amount of the transmitting light is increased, more specifically, by scanning in the direction crossing the boundaries to measure the peak value of the amount of the transmitting light, setting, for example, 5% to 10% of the peak value as a reference value of determination, and measuring the width of the portion where the amount of the transmitting light is increased equal to or larger than the reference value of determination.

Figure 11A:
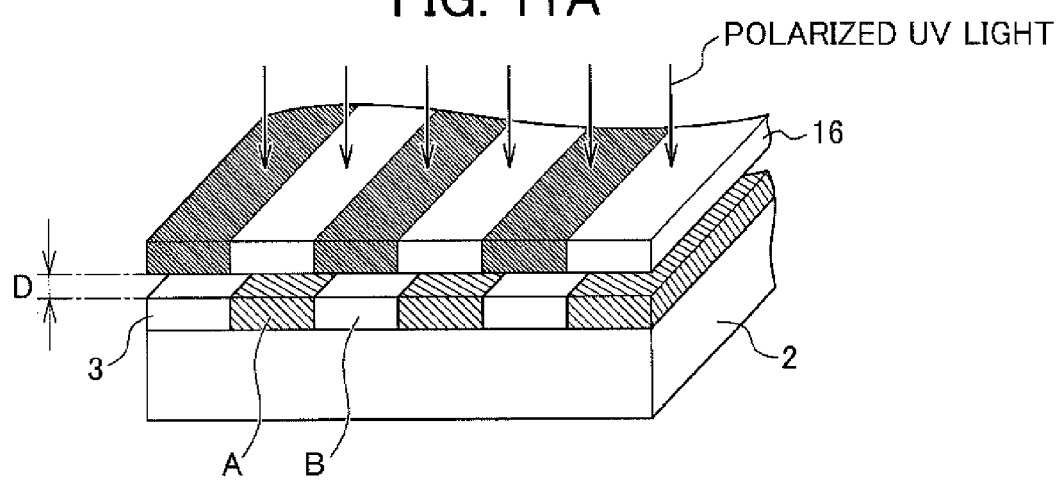
FIG. 11 is a diagram illustrating an exposure process with respect to the pattern phase difference film of FIG. 8.
Figure 11B:
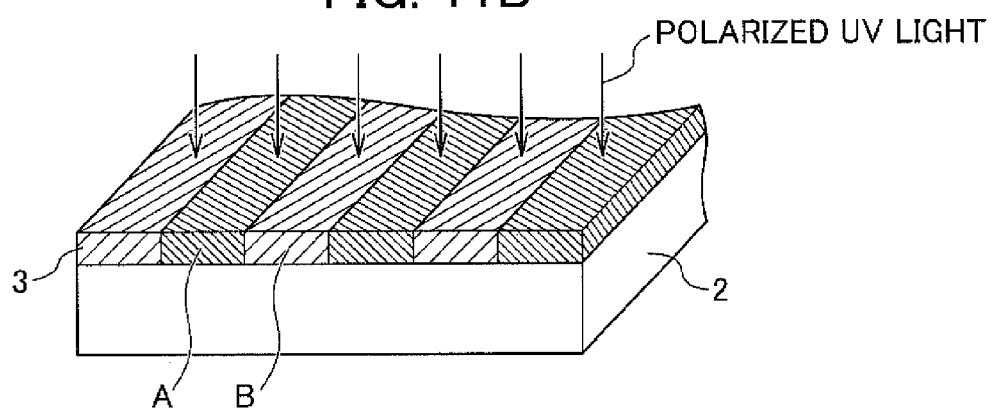

FIG. 11 is a diagram illustrating the setting of the non-aligned area C according to the embodiment in comparison to FIG. 3. Similarly to the above-described first embodiment, in the embodiment, after the first exposure process is performed by using the mask 16 (FIG. 11A), the second exposure process is performed on the entire surface, so that the photo-alignment film 3 is formed (FIG. 11B). In addition, the non-aligned area C is formed to have the above-described area width by setting a distance D between the mask 18 and the photo-alignment material film used for the first exposure process. Herein, the distance D is an actual distance from the portion in the mask 16 relating to control of the transmitting light to the photo-alignment material film side. Therefore, for example, in the case where the mask 16 is formed by pattering a light-blocking member such as chromium on a transparent member and the transparent member is disposed to be in the photo-alignment material film side, the distance D is the distance (optical path length) from the photo-alignment material film side of the light-blocking member.

Herein, in this manner, in the case where the first exposure process is performed in the state where the mask 16 is arranged to be separated by a certain distance D, the light transmitting through the aperture of the mask 16 diverges, so that the area width of the area A or B is increased in comparison to the slit width of the mask as described above in the first embodiment. Therefore, the slit width is set to be smaller than the area width according to the purpose, so that it is possible to produce a pattern phase difference film 21 according to the desired area width.

However, although the portions outside the enlarged areas are not provided to increase the area width, the portions which are irradiated with light for exposure in the first exposure process occur. In such a portion, although a sufficient alignment regulation force is exerted on the phase difference layer, even in the case of the second exposure process, an alignment regulation force relating to the area B or A corresponding to the second exposure process is not also exerted, and thus, it is determined that the non-aligned areas C are formed by such a portion.

In the case of adjusting and checking various distances D, if the distance D is set to 150 µm, the non-aligned area C can be set to have a width of 9 µm; if the distance D is set to 300 µm, the non-aligned area C can be set to have a width of 15 µm, and if the distance D is set to 650 µm, the non-aligned area C can be set to have a width of 25 µm.

According to the fifth embodiment, the non-aligned areas C which alleviate a great change in optical characteristic are installed at the boundaries between the first and second areas A and B which are the right-eye areas and the left-eye areas on the phase difference layer, and the configuration of forming the mask, of which slit width is set to be small, used for the exposure process is effectively used, so that it is possible to effectively prevent the occurrence of a stripe shaped area the brightness of which is different from those of the other portions due to the regularities of the production period of the first and second areas and the production period of the light-blocking portions installed on the image display panel.

In addition, at this time, the non-aligned areas are formed so as to have a width of 9 µm or more and 25 µm or less, so that it is possible to sufficiently prevent the occurrence of a stripe shaped area the brightness of which is different from those of the other portions in practical use.

In addition, in the case where the photo-alignment film is formed by performing the exposure process by using the mask and, after that, performing the exposure process on the entire surface, the distance between the mask and the photo-alignment material film is set to be 150 µm or more and 650 µm or less in the exposure process, so that it is possible to produce a pattern phase difference film while sufficiently preventing the occurrence of a stripe shaped area the brightness of which is different from those of other portions in practical use by using a general exposure apparatus used for producing the pattern phase difference film.

Sixth Embodiment

Figure 12A:
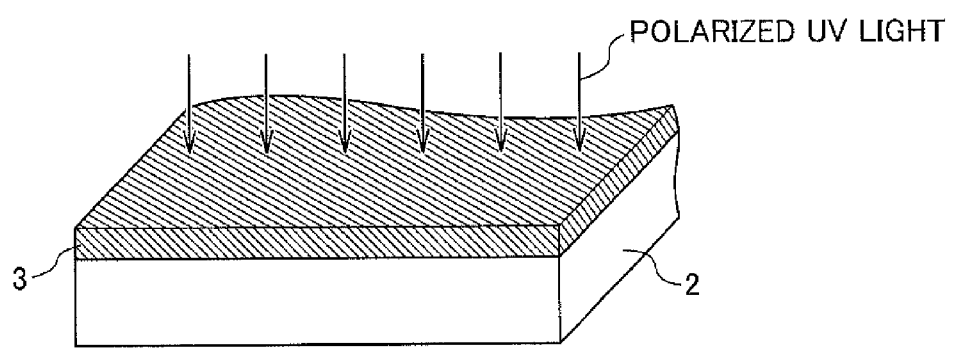
FIG. 12 is a diagram illustrating an exposure process according to the sixth embodiment of the present invention.
Figure 12A:
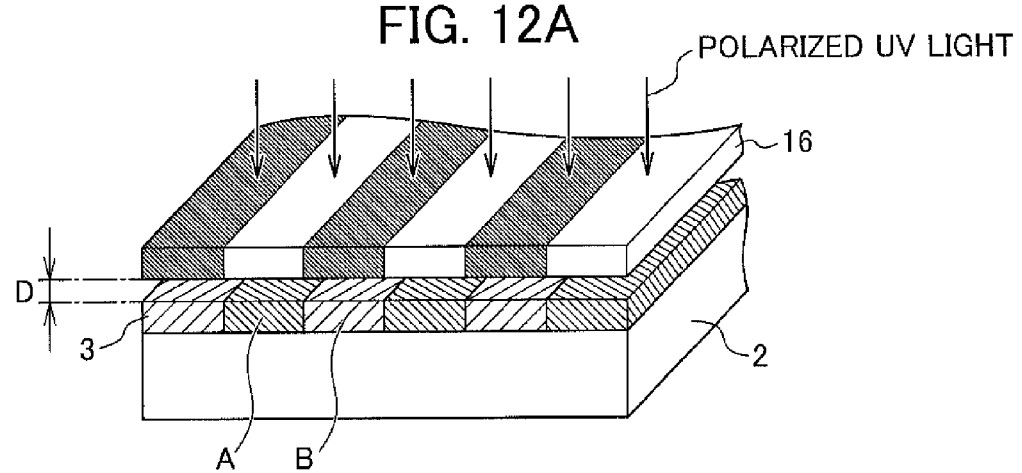

FIG. 12 is a diagram illustrating a method for producing a pattern phase difference film according to the sixth embodiment of the present invention in comparison to FIG. 6. Configurations of the embodiment are the same as those of the above-described second and fifth embodiments except for the configuration relating to FIG. 12. In the embodiment, the entire surface is exposed (FIG. 12A), and after that, a photo-alignment film 3 is formed through the exposure process by using the mask 16. In the embodiment, in a second exposure process which is an exposure process using the mask 16, the non-aligned area C is formed by setting the distance D between the mask 16 and the photo-alignment material film as described above.

Namely, in this case, as described above in the second embodiment, the photo-alignment film is formed by performing the exposure process on the entire surface and, after that, performing the exposure process by using the mask again, so that the area width of the areas formed in the second exposure process is formed to be smaller than the slit width of the mask 16. Therefore, the slit width of the mask 16 is formed to be smaller than the desired area width. In this manner, the non-aligned area C can be formed even in the case where the exposure process is performed on the entire surface, and after that, the exposure process is performed by using the mask again.

In addition, similarly to the above-described fifth embodiment, the distance D is set to be 150 µm or more and 650 µm or less, so that the area width of the non-aligned area is formed to be 9 µm or more and 25 µm or less.

According to the embodiment, even in the case where the photo-alignment film is formed by performing the exposure process on the entire surface and, after that, performing the exposure process by using the mask again, it is possible to obtain the same effects as those of the fifth embodiment by preparing the non-aligned area.

In addition, in this manner, even in the case where the photo-alignment film is formed by performing the exposure process on the entire surface and, after that, performing the exposure process by using the mask again, the distance between the mask and the photo-alignment material film is set to be 150 µm or more and 650 µm or less in the exposure process, so that it is possible to produce a pattern phase difference film while sufficiently preventing the occurrence of a stripe shaped area the brightness of which is different from those of other portions in practical use by using a general exposure apparatus used for producing the pattern phase difference film.

Seventh Embodiment

Figure 13A:
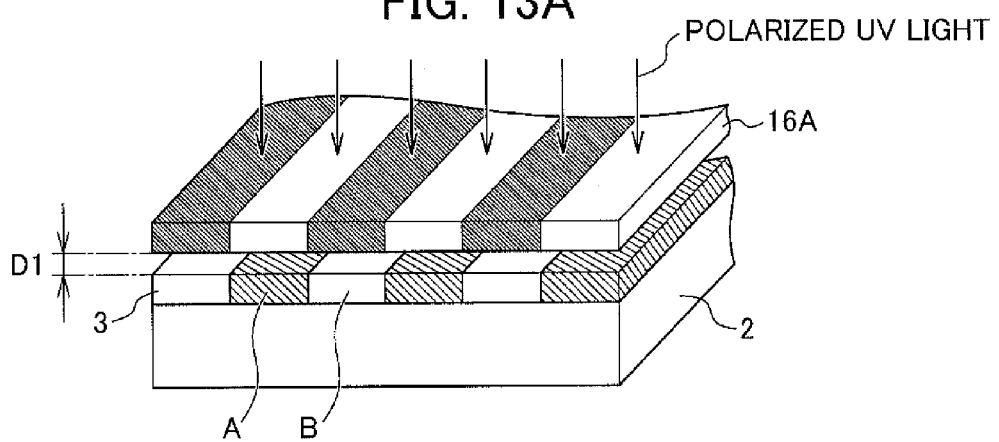
FIG. 13 is a diagram illustrating an exposure process according to the seventh embodiment of the present invention.
Figure 13B:
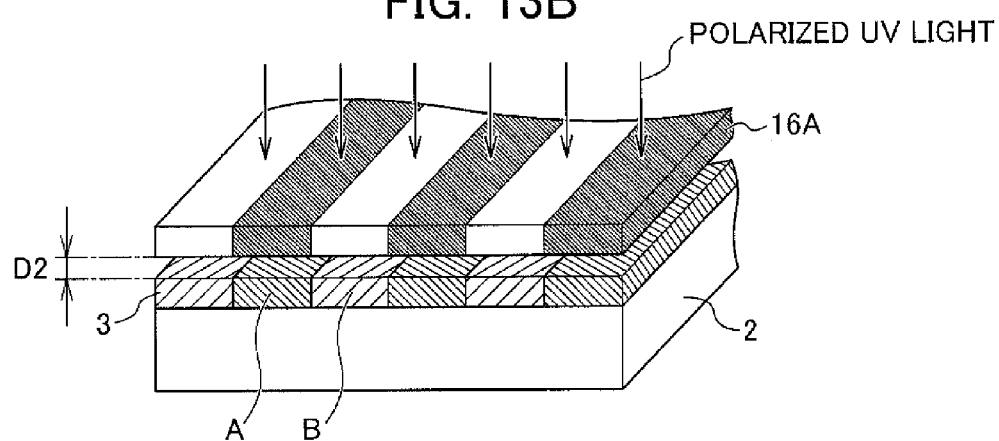
Figure 14:
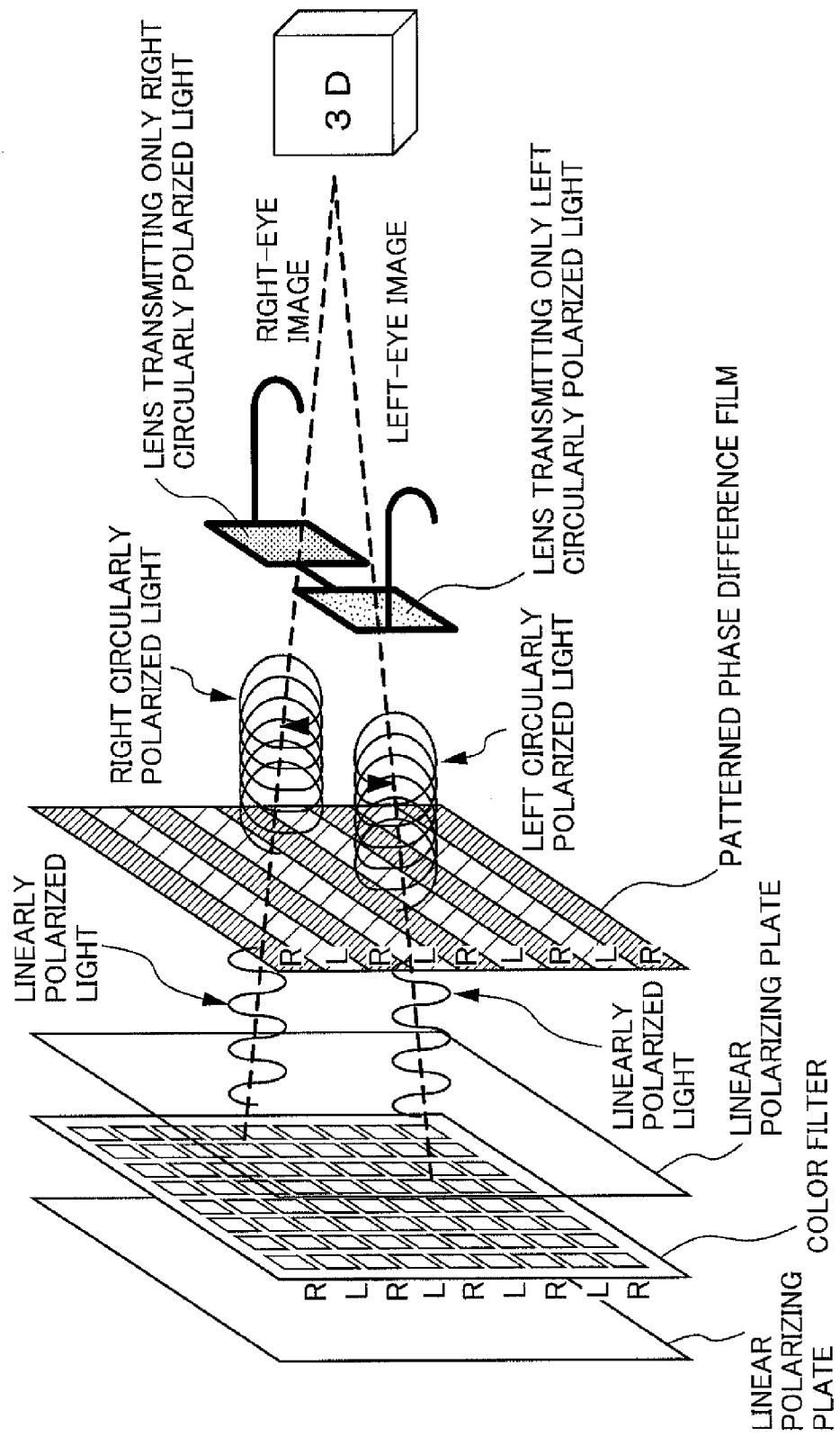
FIG. 14 is a diagram illustrating passive-type 3D image displaying.

FIG. 13 is a diagram illustrating a method for producing a pattern phase difference film according to the seventh embodiment of the present invention in comparison to FIG. 7. In the embodiment, configurations of the embodiment are the same as those of the above-described third to fifth embodiments except for the configuration relating to FIG. 13. Similarly to the above-described third or fourth embodiment, in the embodiment, the first exposure process is performed by using a mask 16A (FIG. 13A), and the second exposure process is performed by using a mask 16B (FIG. 13B), so that a photo-alignment film 3 is formed. In the embodiment, in one or both of the first exposure process which is the exposure process using the mask 16A and the second exposure process which is the exposure process using the mask 16B, the non-aligned area C is formed by setting the distance D1 and/or D2 between the mask 16A and/or 16B and the photo-alignment material film as described above.

In addition, similarly to the above-described fifth embodiment, by setting the distance D1 and/or D2 to be 150 μm or more and 650 μm or less, the area width of the non-aligned area is formed to be 9 μm or more and 25 μm or less.

According to the embodiment, even in the case where the photo-alignment film is formed in repetitive exposure processes using a mask, the non-aligned area is provided so that it is possible to obtain the same effects as those of the fifth embodiment.

In addition, in this manner, even in the case where the photo-alignment film is formed by repetitively performing the exposure process by using the mask, the distance between the mask and the photo-alignment material film is set to be 150 μm or more and 650 μm or less, so that it is possible to produce a pattern phase difference film while sufficiently preventing the occurrence of a stripe shaped area the brightness of which is different from those of other portions in practical use by using a general exposure apparatus used for producing the pattern phase difference film.

Other Embodiments

Although specific configurations suitable for embodiments of the present invention are described in detail above, the present invention can be embodied as various combinations of the above-described embodiments without departing from the spirit of the present invention, and configurations of the above-described embodiments can be changed to be various configurations.

In other words, in the above-described embodiment, although the case where the photo-alignment material film and the mask are separated from each other by a certain distance on the assumption that light from the light source to be used for exposure cannot be set as completely parallel light has been described, the present invention is not limited thereto, but the present invention can also be widely applied to the case where the light from the light source is the parallel light.

In addition, in the above-described embodiments, although the case where the exposure process is performed in the state that the photo-alignment material film and the mask are separated from each other by a certain distance has been described, the present invention is not limited thereto, but the present invention can also be widely applied to the case where the exposure is performed in the state where the mask is allowed to be close to the photo-alignment material film. In addition, in this case, for example, the mask is formed by forming the light-blocking portions on a transparent substrate made of a transparent resin or the like by using chromium or the like, and the transparent substrate is set at the photo-alignment material film side and is exposed in the state where the transparent substrate is close to the photo-alignment material film. Therefore, by controlling the thickness of the transparent substrate and/or by controlling the intensity of light by applying light diffusion characteristic to the transparent substrate, it is possible to obtain the same effects as those of the above-described fifth to seventh embodiments.

In addition, in the above-described embodiments, although the case of producing the pattern phase difference film on the assumption of the use of a liquid crystal display panel has been described, the present invention is not limited thereto. The present invention may be widely applied to cases where polarizing filters are integrally provided on the assumption of the use of an organic EL panel or a plasma display panel.

The invention claimed is:

1. A method for producing a pattern phase difference film by sequentially processing an elongated transparent film material while transporting the elongated transparent film material, comprising:
   forming a photo-alignment material film on the transparent film material;
   forming an alignment film by performing an exposure process on the photo-alignment material film by using a mask through a photo-alignment method, wherein a distance between the mask and the photo-alignment material film is set to be 150 μm or more and 650 μm or less; and
   forming a phase difference layer of a right-eye area applying phase difference corresponding to right-eye transmitting light and a left-eye area applying phase difference corresponding to left-eye transmitting light on the alignment film,
   wherein, in the exposure process, the alignment film is formed by selectively exposing the photo-alignment material film by using the mask in a first exposure process, and after that, exposing the non-exposed area in the first exposure process by irradiating the entire surface with light in a second exposure process, and thus the photo-alignment material film of the portion corresponding to the right-eye area or the left-eye area is aligned, and after that, the photo-alignment material film of the portion corresponding to the left-eye area or the right-eye area is aligned, and
   wherein the mask is formed so that a slit width of the mask is smaller than an area width of the areas used for the first exposure process.

2. A method for producing a pattern phase difference film by sequentially processing an elongated transparent film material while transporting the elongated transparent film material, comprising:
   forming a photo-alignment material film on the transparent film material;
   forming an alignment film by performing an exposure process on the photo-alignment material film by using a mask through a photo-alignment method, wherein a distance between the mask and the photo-alignment material film to be 150 μm or more and 650 μm or less; and
   forming a phase difference layer of a right-eye area applying phase difference corresponding to right-eye transmitting light and a left-eye area applying phase difference corresponding to left-eye transmitting light on the alignment film, wherein, in the exposure process, the alignment film is formed by exposing the entire surface of the photo-alignment material film in a first exposure process, and after that, selectively exposing the photo-alignment material film by using the mask in a second exposure process, and thus the photo-alignment material film of the portions corresponding to the right-eye area and the left-eye area is aligned, and after that, the photo-alignment material film of the portion corresponding to the right-eye area or the left-eye area is aligned again, and wherein the mask is formed so that a slit width of the mask is smaller than an area width of the areas used for the second exposure process.

3. A method for producing a pattern phase difference film by sequentially processing an elongated transparent film material while transporting the elongated transparent film material, comprising:

forming a photo-alignment material film on the transparent film material;

forming an alignment film by performing an exposure process on the photo-alignment material film by using a mask through a photo-alignment method; and forming a phase difference layer of a right-eye area applying phase difference corresponding to right-eye transmitting light and a left-eye area applying phase difference corresponding to left-eye transmitting light on the alignment film, wherein:

in the exposure process:

the alignment film is formed by:

aligning the photo-alignment material film of portions corresponding to the right-eye areas or the left-eye areas through an exposure process using a mask in a first exposure process, and after that, aligning the photo-alignment material film of portions corresponding to the left-eye areas or the right-eye areas through an exposure process using a mask in a second exposure process, and a distance between the mask used for the first and/or second exposure processes and the photo-alignment material film is set to be 150 μm or more and 650 μm or less;

the photo-alignment material film is formed by using a photo-alignment material of which alignment is not changed according to an exposure process once the photo-alignment material is aligned, and the mask used for the first exposure process is formed so that a slit width of each slit of the mask is set to be smaller than an area width of each area used for the exposure process.

4. A method for producing a pattern phase difference film by sequentially processing an elongated transparent film material while transporting the elongated transparent film material, comprising:

forming a photo-alignment material film on the transparent film material;

forming an alignment film by performing an exposure process on the photo-alignment material film by using a mask through a photo-alignment method; and forming a phase difference layer of a right-eye area applying phase difference corresponding to right-eye transmitting light and a left-eye area applying phase difference corresponding to left-eye transmitting light on the alignment film, wherein:

in the exposure process:

the alignment film is formed by:

aligning the photo-alignment material film of portions corresponding to the right-eye areas or the left-eye areas through an exposure process using a mask in a first exposure process, and after that, aligning the photo-alignment material film of portions corresponding to the left-eye areas or the right-eye areas through an exposure process using a mask in a second exposure process, and a distance between ask used for the first and/or second exposure processes and the photo-alignment material film is set to be 150 μm or more and 650 μm or less;

the photo-alignment material film is formed by using a photo-alignment material an alignment direction of which is changed in each of repetitive exposure processes, and the mask used for the second exposure process is formed so that a slit width of each slit of the mask is set to be smaller than an area width of each area used for the exposure process.

* * * * *